US008181145B2

(12) United States Patent
Rice et al.

(10) Patent No.: US 8,181,145 B2
(45) Date of Patent: May 15, 2012

(54) METHOD AND APPARATUS FOR GENERATING A FLOORPLAN USING A REDUCED NETLIST

(75) Inventors: Kester B. Rice, Monument, CO (US); David L. Peart, Round Rock, TX (US)

(73) Assignee: Synopsys, Inc., Mountain View, CA (US)

( * ) Notice: Subject to any disclaimer, the term of this patent is extended or adjusted under 35 U.S.C. 154(b) by 463 days.

(21) Appl. No.: 12/402,246

(22) Filed: Mar. 11, 2009

(65) Prior Publication Data

US 2010/0235799 A1    Sep. 16, 2010

(51) Int. Cl.
*G06F 17/50* (2006.01)
*G06F 9/455* (2006.01)

(52) U.S. Cl. ........ 716/134; 716/132; 716/133; 716/135; 716/139

(58) Field of Classification Search .......... 716/100–107, 716/118–119, 132–135, 139
See application file for complete search history.

(56) References Cited

U.S. PATENT DOCUMENTS

| | | | |
|---|---|---|---|
| 5,831,869 A * | 11/1998 | Ellis et al. | 716/103 |
| 6,799,309 B2 * | 9/2004 | Dhanwada et al. | 716/122 |
| 7,086,029 B1 * | 8/2006 | Barras et al. | 716/103 |
| 7,120,883 B1 * | 10/2006 | van Antwerpen et al. | 716/102 |
| 2006/0004557 A1 | 1/2006 | Maturana et al. | |
| 2007/0156367 A1 | 7/2007 | Kucukcakar et al. | |
| 2008/0244506 A1 | 10/2008 | Killian et al. | |

OTHER PUBLICATIONS

Kapadia, H. et al., "Using Partitioning to Help Convergence in the Standard-cell Design Automation", In: Proceedings of the 36th annual ACM/IEEE Design Automation Conference, ACM, 1999, pp. 592-597.

* cited by examiner

*Primary Examiner* — Nghia Doan
(74) *Attorney, Agent, or Firm* — Park, Vaughan, Fleming & Dowler LLP; Laxman Sahasrabuddhe

(57) ABSTRACT

One embodiment provides a system comprising methods and apparatuses that generate a floorplan for a hierarchical circuit design. More specifically, the system can receive a non-reduced netlist description for the hierarchical circuit design, and generate a reduced netlist which includes the interface logic elements of the netlist. The system can then generate the floorplan by using the reduced netlist as input. Note that the amount of computational resources and time required to generate a floorplan is substantially reduced because the system generates the floorplan using the reduced netlist instead of using the non-reduced netlist.

21 Claims, 9 Drawing Sheets

METHOD AND APPARATUS FOR GENERATING A FLOORPLAN USING A REDUCED NETLIST

BACKGROUND

1. Field

This disclosure is generally related to electronic design automation. More specifically, this disclosure is related to methods and apparatuses for generating a floorplan for a circuit design.

2. Related Art

Advances in semiconductor fabrication technology have given rise to dramatic increases in the number of transistors per semiconductor device. This increase in transistor count is empowering computer architects to create digital circuit designs with ever-increasing complexity. As digital circuit designs become more complex, the effort required to place and route circuit elements into a transistor layout also becomes more involved.

In a circuit design flow, a floorplan for the circuit design is usually created before performing detailed placement and routing. The floorplan can specify how the various functional blocks in the circuit design are arranged on the chip. Furthermore, the floorplan is typically used to guide the subsequent placement and routing process.

The process for generating a floorplan is interactive, and requires a number of iterations to refine the floorplan until its characteristics are acceptable. For example, a floorplanning process may require an engineer to iteratively refine the floorplan until the timing and routability characteristics of the floorplan are acceptable.

A single floorplanning iteration can take more than a work day for very large designs. Furthermore, larger circuit designs usually require a larger number of floorplanning iterations.

SUMMARY

One embodiment provides a system comprising methods and apparatuses that generate a floorplan for a circuit design. More specifically, some embodiments receive a non-reduced netlist (e.g., a full netlist) for the circuit design, and generate a reduced netlist which includes substantially fewer elements than the non-reduced netlist. The system can then generate the floorplan by using the reduced netlist as input.

Note that using the reduced netlist allows the system to generate a floorplan with less computation (and in less time) than would be required if the system had used the non-reduced netlist. Stated differently, using the reduced netlist allows the system to generate floorplans for much larger circuit designs in the same amount of time. Furthermore, note that, although the reduced netlist has substantially fewer elements than the non-reduced netlist, the reduced netlist has enough details so that the floorplan can be accurately analyzed to ensure that it satisfies the design constraints.

A circuit design can be represented using a set of hierarchical blocks, wherein a floorplan typically specifies an arrangement for the set of blocks. In some embodiments, the reduced netlist includes only those portions of the non-reduced netlist that are associated with a block's interface logic. Specifically, the block's interface logic can include: the block's interface pins; combinational logic coupled between interface pins; registers in the block that are coupled with the block's interface pins via combinational logic; and the combinational logic that couples the block's interface pins with the registers.

In some embodiments, the system includes hard macros in the reduced netlist regardless of whether the hard macro is part of the interface logic. The system can identify a hard macro instance in the block by selecting a macro instance name from a set of macro instance names, or by determining that a macro instance has a type attribute which matches a qualifying macro type. Alternatively, the system can identify a hard macro instance by selecting a cell in the block whose interface pins are greater than or equal to a threshold pin count. In yet another approach, the system can identify a hard macro instance by selecting a cell in the block with an area greater than or equal to a threshold area.

In some embodiments, the system can generate the floorplan so that it satisfies a set of design constraints. The set of design constraints can include at least one of: a timing constraint; a power constraint; a routing congestion constraint; an area constraint; a shape constraint; and a placement constraint.

BRIEF DESCRIPTION OF THE FIGURES

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Integrated Circuit (IC) Design Flow

Figure 1:
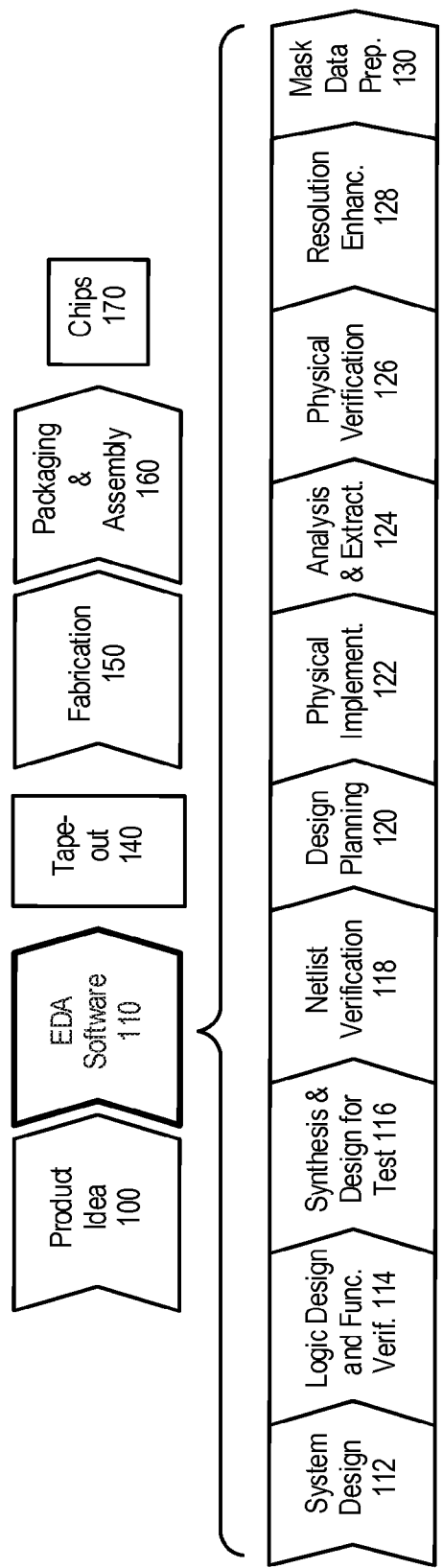
FIG. 1 illustrates various stages in the design and fabrication process of an integrated circuit in accordance with an embodiment.

FIG. 1 illustrates various stages in the design and fabrication process of an integrated circuit in accordance with an embodiment.

The IC design process typically begins with a product idea (operation 100) which is realized using an EDA process (operation 110). Once the design is finalized, it is typically taped-out (event 140), at which point it goes through a fabrication process (operation 150) and packaging and assembly processes (operation 160) to produce manufactured microchips (result 170).

The EDA process (operation 110) comprises operations 112-130, which are described below for illustrative purposes only and are not meant to limit the present invention. Specifically, an actual integrated circuit design may require a designer to perform the design operations in a different sequence than the sequence described below.

System design (operation 112): In this stage, the designers describe the functionality that implements the product idea. They can also perform what-if planning to refine the functionality, perform cost analysis, etc. Hardware-software architecture partitioning can occur at this stage. Exemplary EDA software products from Synopsys, Inc. that can be used at this stage include Model Architect, Saber®, System Studio, and DesignWare®.

Logic design and functional verification (operation 114): At this stage, the VHDL or Verilog code for modules in the system is written and the design is checked for functional accuracy. More specifically, the design is checked to ensure that it produces a correct response. Exemplary EDA software products from Synopsys, Inc. that can be used at this stage include VCS®, Vera®, DesignWare®, Magellan™, Formality®, ESP and Leda®.

Synthesis and design for test (operation 116): The VHDL/Verilog source code can be translated to a netlist in this stage. The netlist can be optimized for the target technology, and tests can be designed and implemented to check the manufactured microchips. Exemplary EDA software products from Synopsys, Inc. that can be used at this stage include Design Compiler®, Physical Compiler®, Test Compiler, Power Compiler™, FPGA Compiler, TetraMAX®, and DesignWare®.

Netlist verification (operation 118): In this stage, the netlist is checked for compliance with timing constraints and for correspondence with the VHDL/Verilog source code. Exemplary EDA software products from Synopsys, Inc. that can be used at this stage include Formality®, PrimeTime®, and VCS®.

Design planning (operation 120): In this stage, an overall floorplan for the microchip is constructed and analyzed for timing and top-level routing. Exemplary EDA software products from Synopsys, Inc. that can be used at this stage include Astro™ and IC Compiler products.

Physical implementation (operation 122): The placement (positioning of circuit elements) and routing (placement of interconnections) occur at this stage. Exemplary EDA software products from Synopsys, Inc. that can be used at this stage include Astro™ and IC Compiler products.

Analysis and extraction (operation 124): At this stage, the circuit function is verified at a transistor level; this, in turn, permits what-if refinement. Exemplary EDA software products from Synopsys, Inc. that can be used at this stage include AstroRail™, PrimeRail, PrimeTime®, and Star-RCXT™.

Physical verification (operation 126): In this stage, the design is checked to ensure correctness for manufacturing, electrical issues, lithographic issues, and circuitry. Hercules™ is an exemplary EDA software product from Synopsys, Inc. that can be used at this stage.

Resolution enhancement (operation 128): This stage involves geometric manipulations of the layout to improve manufacturability of the design. Exemplary EDA software products from Synopsys, Inc. that can be used at this stage include Proteus/Progen, ProteusAF, and PSMGen.

Mask data preparation (operation 130): This stage provides the "tape-out" data for production of masks to produce finished chips. Exemplary EDA software products from Synopsys, Inc. that can be used at this stage include the CATS® family of products.

Computing System

Figure 2:
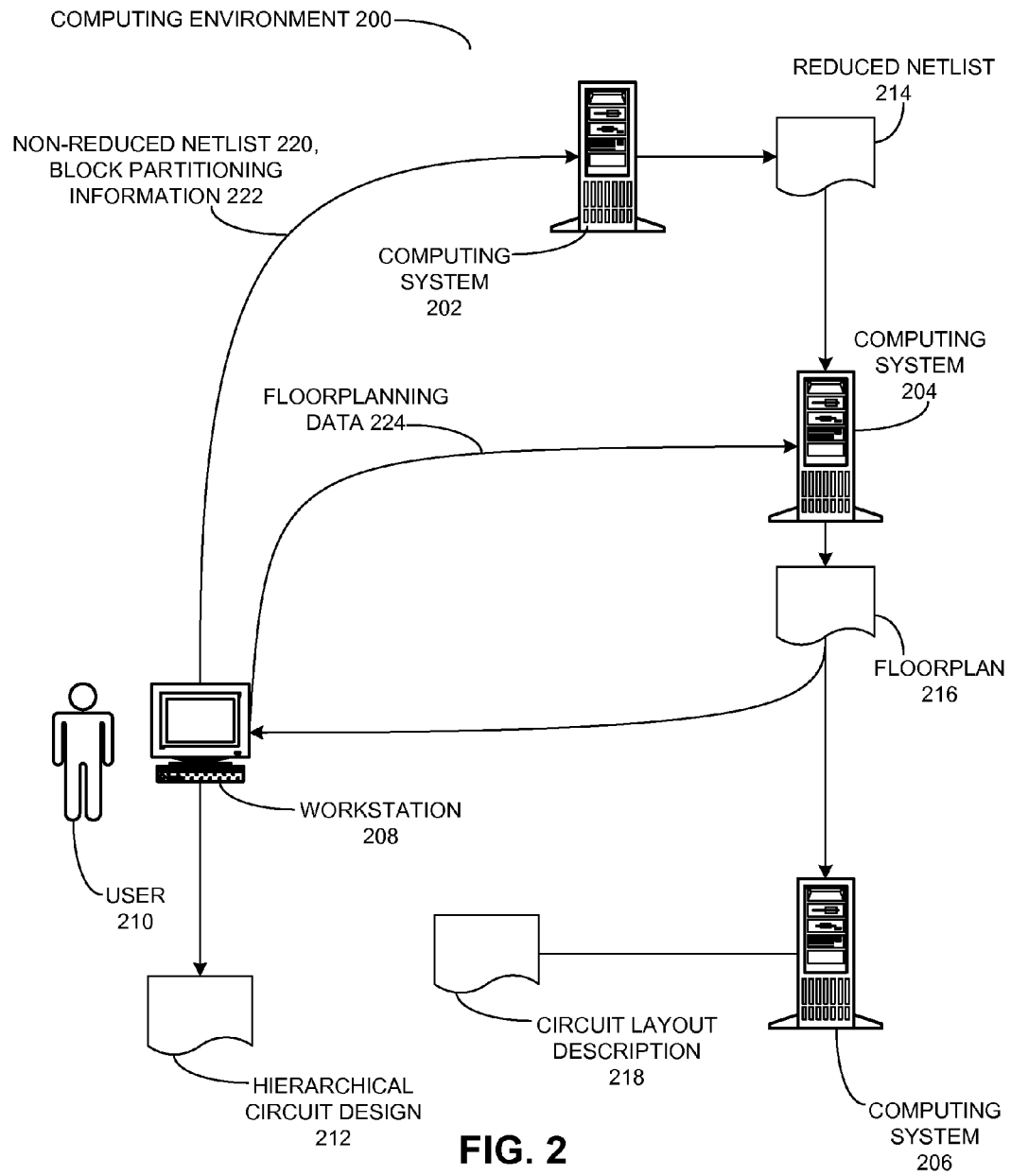
FIG. 2 illustrates a computing environment for generating a floorplan in accordance with an embodiment.

FIG. 2 illustrates a computing environment for generating a floorplan in accordance with an embodiment. Computing environment 200 can include a number of computing systems 202-206, and a workstation 208. More specifically, computing system 202 can generate a reduced netlist 214, and computing system 204 can use reduced netlist 214 to generate a floorplan 216.

During operation, a user 210 can use workstation 208 to generate a non-reduced netlist 220 for a hierarchical circuit design 212. A non-reduced netlist is generally any netlist that includes more circuit elements than those in a reduced netlist. Specifically, a non-reduced netlist for a circuit design can be the full netlist for the circuit design. In some embodiments, user 210 can generate non-reduced netlist 220 using a circuit synthesis system, such as Design Compiler® from Synopsys, Inc. User 210 can then provide non-reduced netlist 220 and block partitioning information 222 to computing system 202 to generate reduced netlist 214. Note that block partitioning information 222 identifies the circuit blocks in non-reduced netlist 220 which correspond to the hierarchical blocks of hierarchical circuit design 212. A block can generally be any portion of a circuit. In some embodiments, a block is a portion of a circuit that implements a particular high-level function. For example, a block can be a memory.

In some embodiments, computing system 202 can generate reduced netlist 214 from non-reduced netlist 220 and block partitioning information 222. Reduced netlist 214 includes the logic elements of hierarchical circuit design 212 which are necessary for generating floorplan 216, assigning interface pins to a hierarchical block of the circuit design, and determining timing constraint budgets for a block of the circuit design. Furthermore, reduced netlist 214 can omit logic elements of hierarchical circuit design 212 which are not necessary for generating floorplan 216.

In some embodiments, reduced netlist 214 can include the interface logic for a hierarchical block of the circuit design, wherein the interface logic includes at least one of: the block's interface pins; combinational logic that couples two or more interface pins; registers in the block that are coupled with the block's interface pins via combinational logic; and the combinational logic that couples the block's interface pins with the registers. In some embodiments, the combinational logic does not include any sequential circuit elements. In particular, the combinational logic does not include any registers. Hence, a register that is coupled with an interface pin via the combinational logic is the first register on a path from the interface pin to the register.

Note that reduced netlist 214 includes sufficient information on hierarchical circuit design 212 to enable computing system 204 to determine whether floorplan 216 satisfies the timing requirements for hierarchical circuit design 212. Furthermore, computing system 204 performs an accurate timing analysis of the floorplan design by using the interface logic for the blocks, and does not rely on conventional techniques which use a "black box" model to capture the timing parameters for the block. The "block box" timing model is usually not accurate because the timing model is specified by a user, and the user may not always have a complete or accurate understanding of the block.

Note that the reduced quantity of circuit information in reduced netlist 214 dramatically decreases the amount of information that computing system 204 needs to analyze, thereby allowing computing system 204 to generate floorplan 216 for larger circuit designs than would be possible if computing system 204 used non-reduced netlist 220. Furthermore, the reduced information in reduced netlist 214 also allows computing system 204 to generate floorplan 216 with less computation time than would be required if computing system 204 used non-reduced netlist 220.

In some embodiments, computing system 204 can generate floorplan 216 based in part on reduced netlist 214, and floorplanning data 224. Floorplanning data 224 can include at least one of: a design constraint; a budget parameter (e.g., a timing budget, a power budget, a routing budget); and a set of macro instantiation names. Furthermore, a design constraint can include at least one of: a timing constraint; a power constraint; a routing congestion constraint; an area constraint; a shape constraint; and a placement constraint. In some embodiments, floorplanning data 224 can also include non-reduced netlist 220, which is used by computer system 204 to perform optimizations on floorplan 216.

In some other embodiments, floorplanning data 224 can also include an initial floorplan, which can be a partial floorplan, or can be a modified floorplan that was previously generated by computing system 204. For example, user 210 can create a partial floorplan for hierarchical circuit design 212, which specifies a starting point for computing system 204. In a further example, user 210 can receive floorplan 216 from computing system 204, and determine whether floorplan 216 is acceptable. If user 210 determines that floorplan 216 does not satisfy one or more constraints of floorplanning data 224, then user 210 can make one or more modifications to floorplan 216 to generate a modified floorplan. Then, user 210 can provide the modified floorplan to computing system 204 as a starting point for generating the next version of floorplan 216. Otherwise, if user 210 determines that floorplan 216 is acceptable, then user 210 can provide computing system 206 with floorplan 216 to generate a circuit layout description 218.

In some embodiments, computing systems 202-204 can be implemented in a single computing system for generating floorplan 216 based in part on non-reduced netlist 220. In other embodiments, workstation 208 and computing systems 202-204 can be implemented in a single computing system for generating floorplan 216 based in part on hierarchical circuit design 212.

Generating a Floorplan

Figure 3:
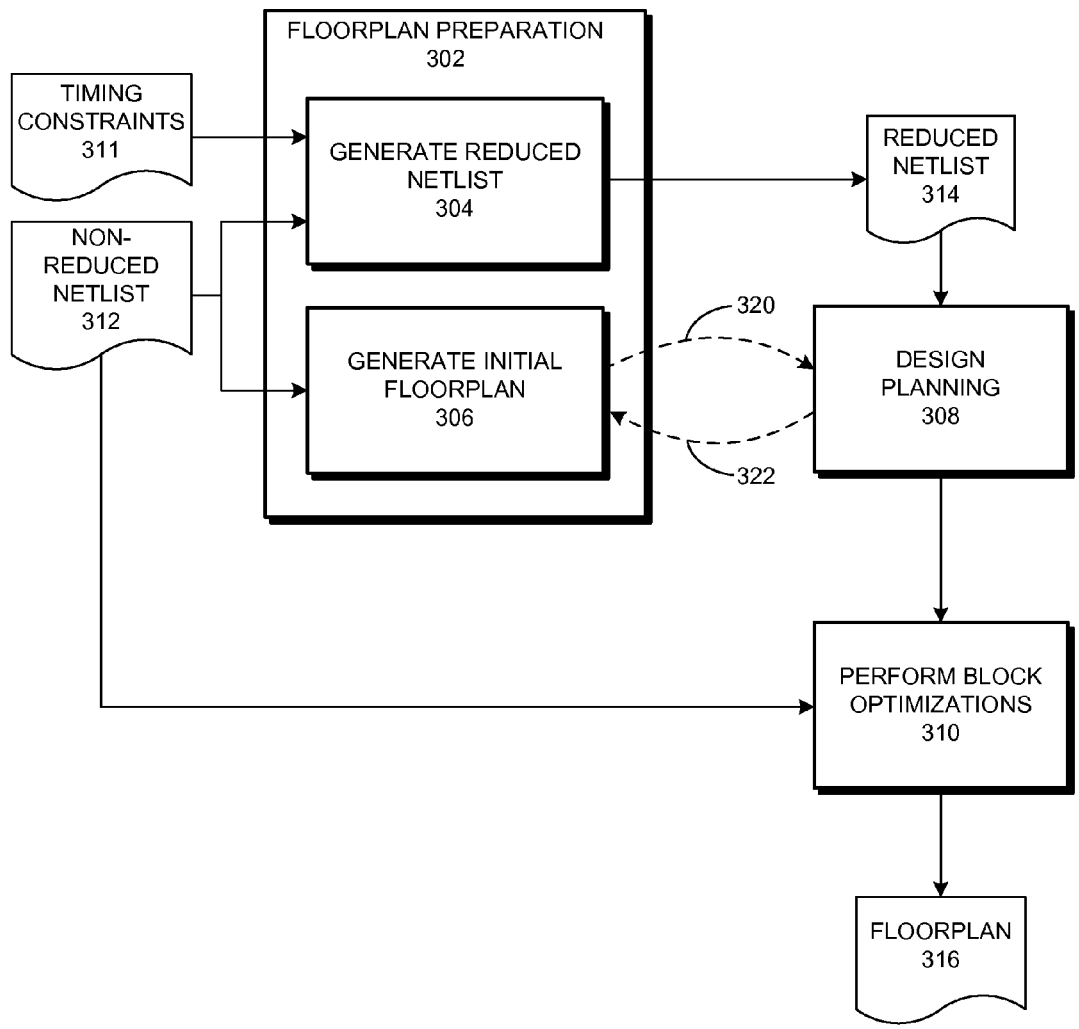
FIG. 3 presents a flow chart illustrating a process for generating a floorplan from a non-reduced netlist of a circuit design in accordance with an embodiment.

FIG. 3 presents a flow chart illustrating a process for generating a floorplan from a non-reduced netlist of a circuit design in accordance with an embodiment. In some embodiments, the process can be performed by a computer system, which includes a computer-readable storage medium storing instructions that when executed by the computer system cause the computer system to perform the process for generating floorplan 316 from non-reduced netlist 312. The system can begin by performing a floorplan preparation procedure 302, which performs a procedure 304 to generate a reduced netlist 314 using timing constraints 311 and non-reduced netlist 312. Then, the system can perform a design planning procedure 308 which can use reduced netlist 314 to generate a floorplan 316 for the circuit design. Optionally, procedure 302 can also perform a procedure 306 to generate an initial floorplan 320, which can be used by procedure 308 as a starting point when generating floorplan 316 for the circuit design.

In some embodiments, the system can perform a number of iterations between procedures 306 and 308 to refine floorplan 316. To perform an iteration, procedure 308 can optionally send a floorplan 322 to procedure 306, and procedure 306 can modify floorplan 322 to generate floorplan 320 that is used by a subsequent iteration of procedure 308.

In some embodiments, procedure 306 can allow a user to generate initial floorplan 320 by specifying the desired placement and routing for a number of logic elements in the non-reduced netlist. In other embodiments, procedure 306 can allow a user to generate initial floorplan 306 by removing portions of floorplan 322 which do not satisfy a number of design decisions, and/or by modifying portions of floorplan 322 to satisfy a number of design decisions. Note that initial floorplan 320 can be a partial floorplan.

In some embodiments, initial floorplan 320 can include at least one of: a top cell boundary, a cell row, an interface pin placement, a hierarchical partition definition, a hard macro placement, and a hierarchical block which has been sized and placed in the floorplan. Note that an optimal sizing of a block is important because a block size needs to accommodate a number of additional cells for the block's internal logic, and to accommodate floorplan adjustments performed during a block optimization procedure 310.

In some embodiments, block optimization procedure 310 can complete the implementation of a block in the hierarchical circuit design by using the floorplan and timing information generated during design planning procedure 308.

Figure 4:
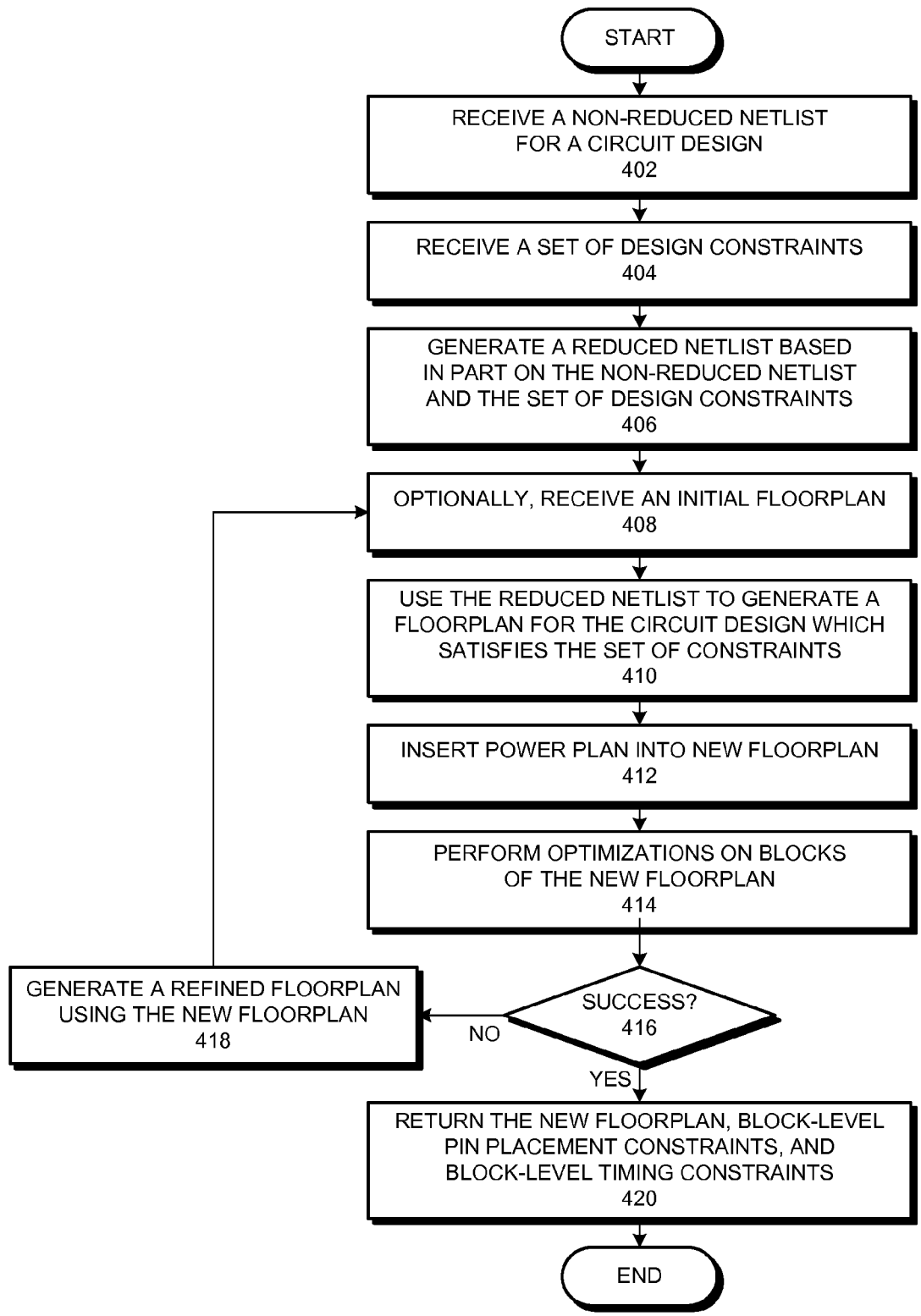
FIG. 4 presents a flow chart illustrating a process for generating a floorplan for a circuit design in accordance with an embodiment.

FIG. 4 presents a flow chart illustrating a process for generating a floorplan for a circuit design in accordance with an embodiment. The system can begin by receiving a non-reduced netlist for the circuit design (operation 402), and receiving a set of design constraints (operation 404). Then, the system generates a reduced netlist based in part on the non-reduced netlist, and on timing constraints from the set of design constraints (operation 406). Optionally, the system can receive an initial floorplan for the circuit design (operation 408), which can be used as a starting point for generating a new floorplan for the circuit design.

Then, the system can use the reduced netlist, and optionally the initial floorplan, to generate a floorplan for the circuit design which satisfies the set of constraints (operation 410). Next, the system inserts a power plan into the new floorplan (operation 412), and performs optimizations on blocks of the new floorplan (operation 414). In some embodiments, the system can receive a power plan for the floorplan before performing operation 412. For example, the system can receive a power plan that has been custom built for the circuit design, or can receive a power plan which has been tailored for the floorplan from a similar circuit design.

The system then determines whether the new floorplan satisfies the set of constraints (operation 416). If so, the system returns the new floorplan, block-level pin placement constraints, and block-level timing constraints (operation 420). Otherwise, if the new floorplan does not satisfy the set of constraints, a user can use the system to generate a refined floorplan using the new floorplan (operation 418), and then returns to operation 408.

In some embodiments, operations 408 and 418 allow a user to modify an existing floorplan, and to repeat the process for generating a floorplan for the circuit design. For example, a user may need to perform a number of iterations of the process, refining the floorplan at each iteration, until an acceptable floorplan has been generated. Furthermore, note that operation 410 generates the new floorplan based in part on a reduced netlist, thereby ensuring that each iteration of the process requires less computation time than would be required if the non-reduced netlist were used.

In some embodiments, operation 418 allows a user to generate a refined floorplan by removing portions of the new floorplan which do not satisfy a number of design decisions, and/or by modifying portions of the new floorplan to satisfy a number of design decisions.

Generating a Reduced Netlist

Figure 5:
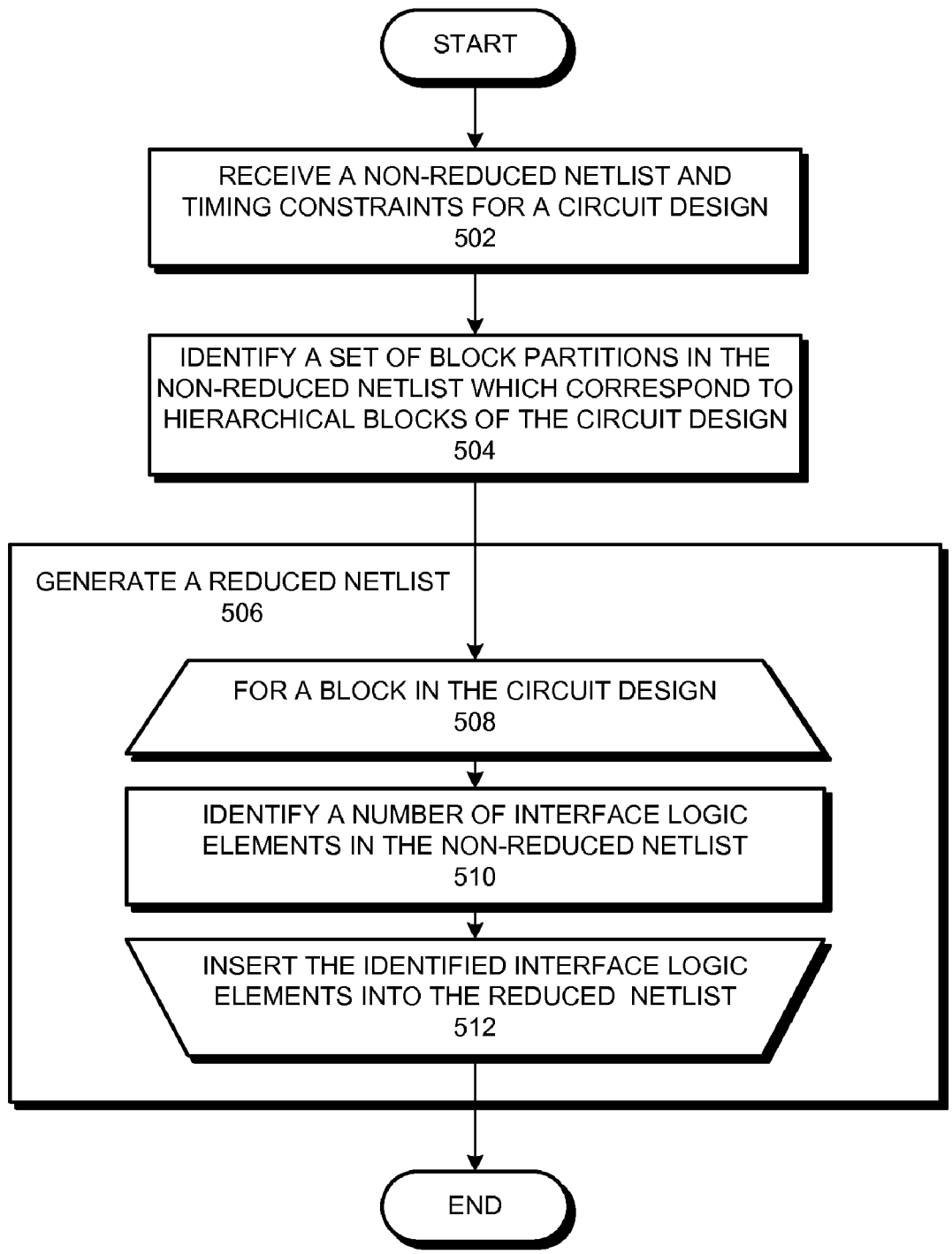
FIG. 5 presents a flow chart illustrating a process for generating a reduced netlist in accordance with an embodiment.

FIG. 5 presents a flow chart illustrating a process for generating a reduced netlist in accordance with an embodiment. In some embodiments, the process expands upon operation 406 of FIG. 4. The system can begin by receiving a non-reduced netlist and timing constraints for a circuit design (operation 502), and identifying a set of block partitions in the non-reduced netlist, which corresponds to a set of hierarchical blocks of the circuit design (operation 504).

Next, the system generates a reduced netlist (operation 506), based in part on the non-reduced netlist and the identified block partitions. For a block in the circuit design (operation 508), the system identifies a number of interface logic elements in the non-reduced netlist (operation 510), and inserts the identified interface logic elements into the reduced netlist (operation 512). In some embodiments, the block's interface logic can include: the block's interface pins; registers in the block that are coupled with the block's interface pins via combinational logic; and the combinational logic that couples the block's interface pins with the registers. Furthermore, the reduced netlist can include information about how a set of blocks of the circuit design are coupled with one another.

In some embodiments, the system can incorporate a hard macro instance from the non-reduced netlist into the reduced netlist regardless of whether the hard macro is part of the interface logic or not. In some variations, the system identifies a hard macro instance by selecting a macro instance name from a set of macro instance names, or by determining that a macro instance has a type attribute which matches a qualifying macro type. In other variations, the system identifies a hard macro instance by selecting a cell in the block with a number of interface pins greater than or equal to a threshold pin count. In further variations, the system identifies a hard macro instance by selecting a cell in the block with an area greater than or equal to a threshold area.

Generating a Floorplan from the Reduced Netlist

Figure 6:
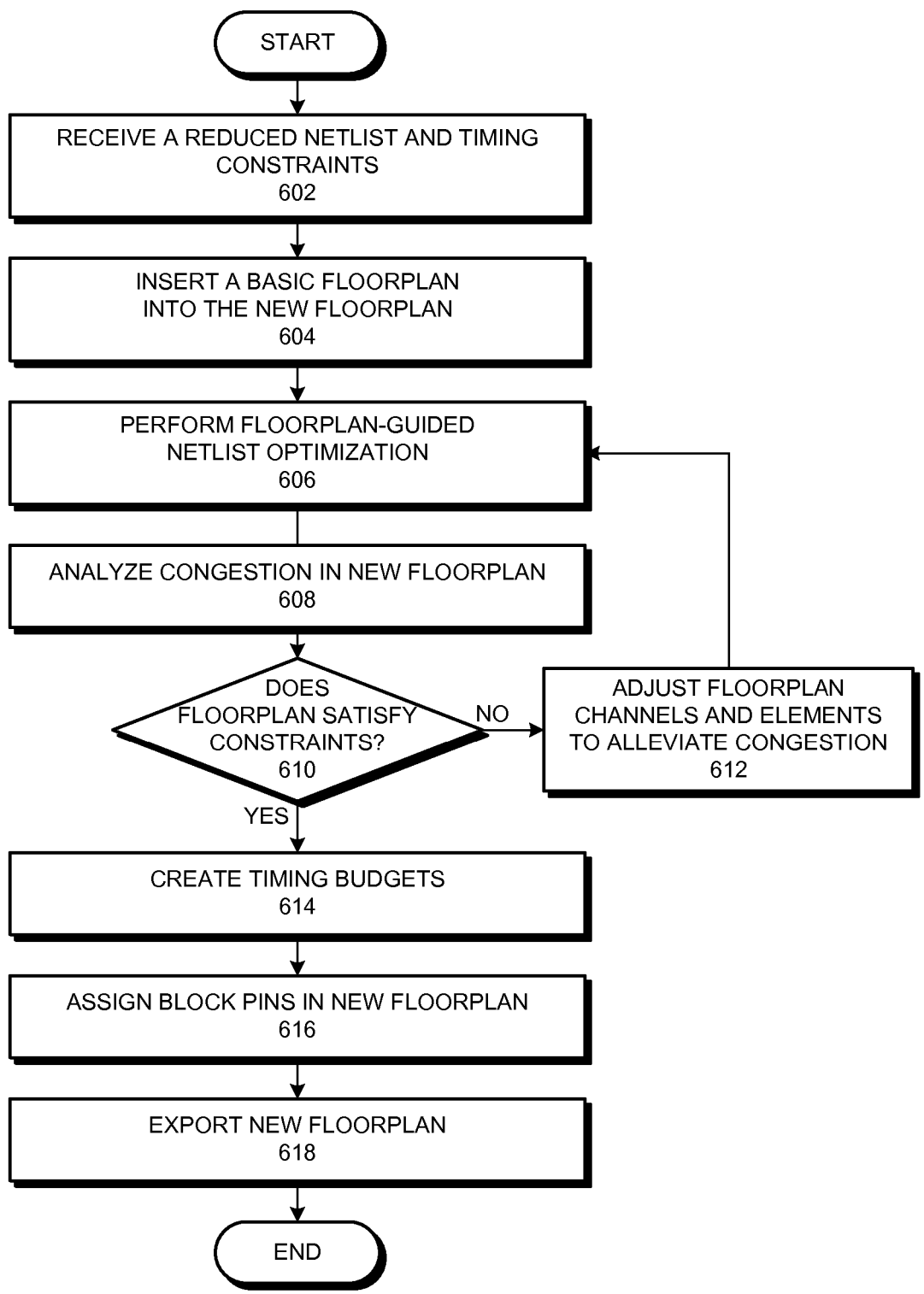
FIG. 6 presents a flow chart illustrating a process for using a reduced netlist to generate a floorplan in accordance with an embodiment.

FIG. 6 presents a flow chart illustrating a process for using a reduced netlist to generate a floorplan in accordance with an embodiment. In some embodiments, the process expands upon operation 410 of FIG. 4. The system can begin by receiving a reduced netlist and timing constraints (operation 602), and inserting a basic floorplan into the new floorplan (operation 604). Then, the system performs floorplan-guided netlist optimization (operation 606), and analyzes congestion in the new floorplan (operation 608). Next, the system determines if the floorplan satisfies the constraints (operation 610). If the floorplan does not satisfy the constraints, the system adjusts the floorplan channels and other floorplan elements to alleviate congestion (operation 612), and returns to operation 606. Otherwise, if the floorplan satisfies the constraints, the system creates timing budgets for the hierarchical blocks (operation 614), assigns block pins in the new floorplan (operation 616), and exports the new floorplan (operation 618).

In some embodiments, operation 612 can allow a user to specify a number of blocks to ignore when adjusting the floorplan to alleviate congestion. When a user identifies a set of blocks to preserve, operation 614 adjusts floorplan channels to alleviate congestion for the remainder of the blocks not identified by the user.

Block Optimizations

Figure 7:
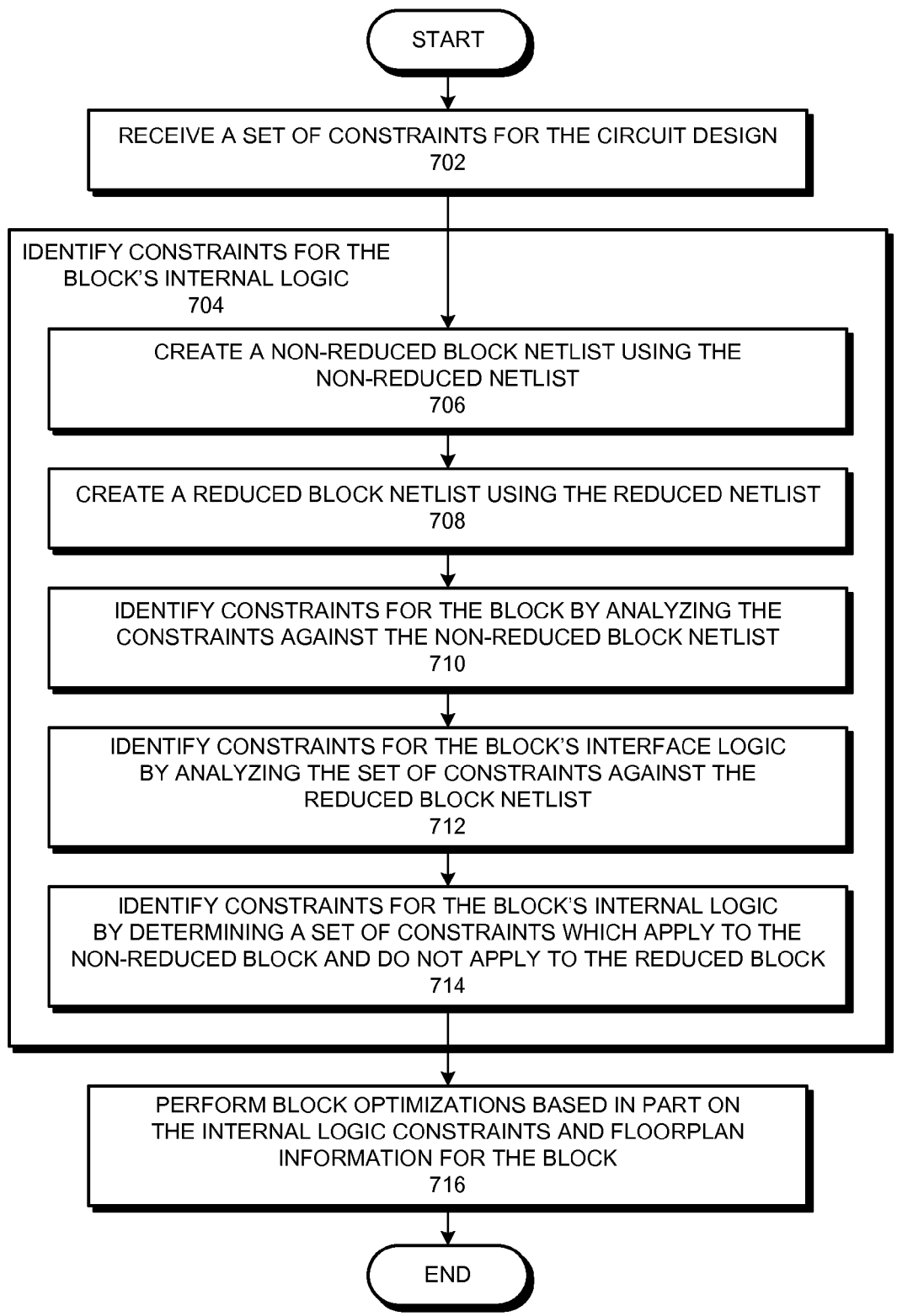
FIG. 7 presents a flow chart illustrating a process for performing block optimizations on a floorplan generated using a reduced netlist in accordance with an embodiment.

FIG. 7 presents a flow chart illustrating a process for performing block optimizations on a floorplan generated using a reduced netlist in accordance with an embodiment. The system can begin by receiving a set of constraints for the circuit design (operation 702). Next, the system identifies constraints for the block's internal logic (operation 704). Note that the block's internal logic includes logic elements of the block which are not a part of the block's interface logic.

To identify constraints for the block's internal logic, the system creates a non-reduced block netlist using the non-reduced netlist (operation 706), and creates a reduced block netlist using the reduced netlist (operation 708). Next, the system identifies constraints for the block by analyzing the set of constraints against the non-reduced block netlist (operation 710). The system also identifies constraints for the block's interface logic by analyzing the set of constraints against the reduced block netlist (operation 712). Then, the system identifies constraints for the block's internal logic by determining a set of constraints which apply to the non-reduced block and do not apply to the reduced block (operation 714). In other words, the system identifies constraints for the block's internal logic by identifying a set of constraints for the block which do not exist in the set of constraints for the block's interface logic. The system can then perform optimizations on the block's floorplan based in part on the internal logic constraints and floorplan information for the block (operation 716).

In some embodiments, the system can allow a user to specify floorplan information which identifies characteristics of the block's floorplan which the user wants to preserve. In response, the system can preserve the identified characteristics in the floorplan information. The floorplan information can include at least one of: a block boundary, a core definition of the circuit design (i.e., rows and tracks), a hard macro, an interface pin placement, and prerouting information for power and ground.

Figure 8:
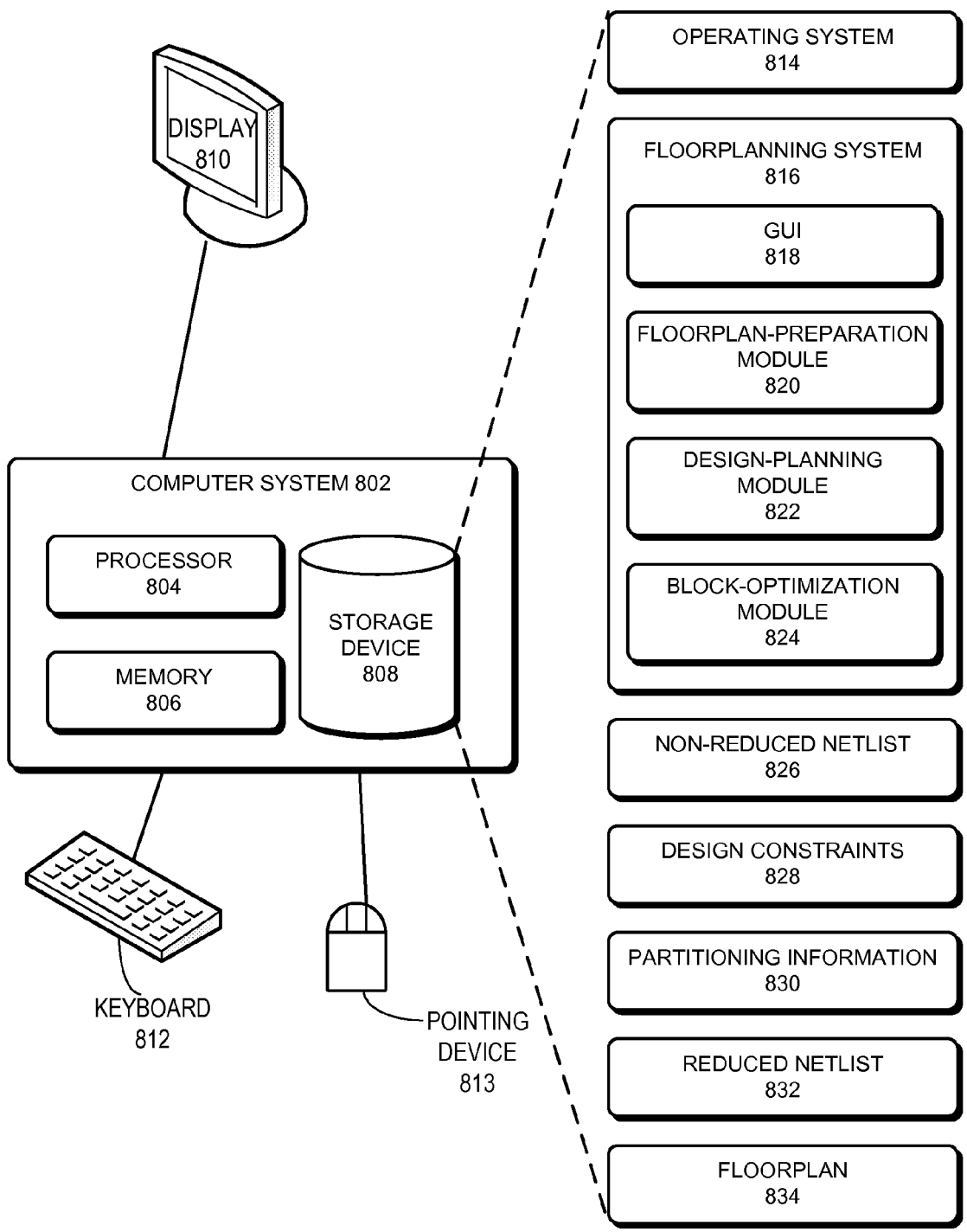
FIG. 8 illustrates an exemplary computer system that facilitates generating a floorplan for a circuit design in accordance with an embodiment.

FIG. 8 illustrates an exemplary computer system that facilitates generating a floorplan for a circuit design in accordance with an embodiment. Computer system 802 includes a processor 804, a memory 806, and a storage device 808.

Furthermore, computer system 802 can be coupled to a display 810, a keyboard 812, and a pointing device 813.

Storage device 808 stores an operating system 814, a floorplanning system 816, a non-reduced netlist 826, design constraints 828, partitioning information 830, a reduced netlist 832, and a floorplan 834. Floorplanning system 816 can include a graphical user interface (GUI) 818, a floorplan-preparation module 820, a design-planning module 822, and a block-optimization module 824.

During operation, floorplanning system 816 is loaded from storage device 808 into memory 806 and is executed by processor 804. In some embodiments, floorplanning system 816 can generate a floorplan 834 for a circuit design which satisfies design constraints 828. In doing so, floorplan-preparation module 820 can generate a reduced netlist 832 from non-reduced netlist 826, which includes interface logic for a hierarchical block of the circuit design specified in partitioning information 830. Then, design-planning module 822 can use reduced netlist 832 to generate a preliminary version of floorplan 834, and block-optimization module 824 can use non-reduced netlist 826 to generate a final version of floorplan 834 which is optimized to account for the internal logic of the hierarchical block.

Figure 9:
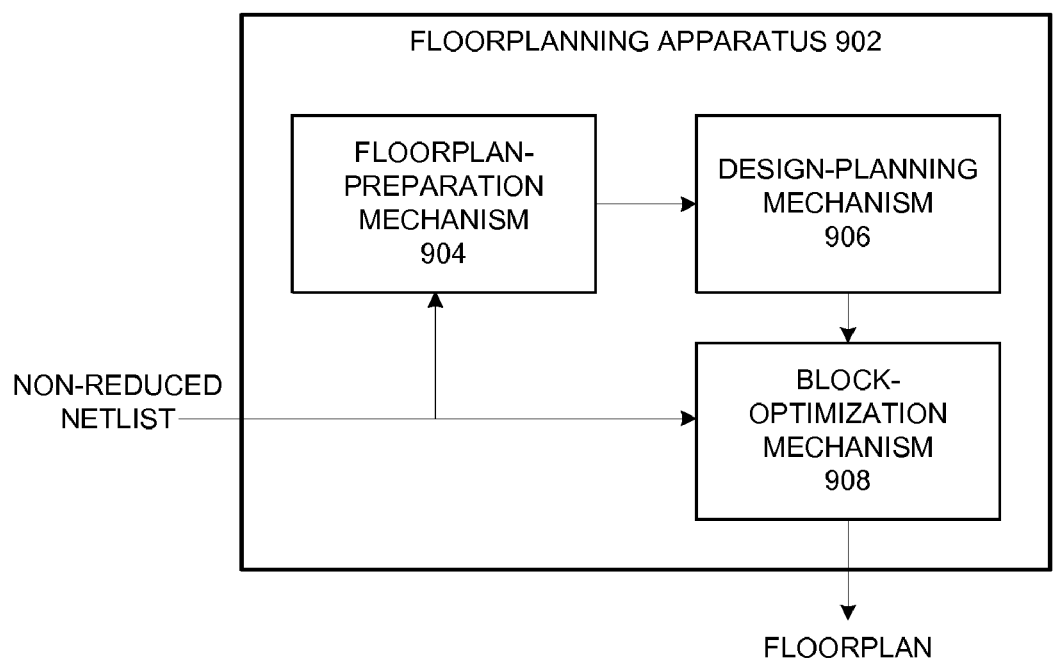
FIG. 9 illustrates an apparatus that facilitates generating a floorplan for a circuit design in accordance with an embodiment.

FIG. 9 illustrates an apparatus that facilitates generating a floorplan for a circuit design in accordance with an embodiment.

Apparatus 902 can comprise a number of mechanisms which may communicate with one another via a wired or wireless communication channel. Apparatus 902 may be realized using one or more integrated circuits, and it may be integrated in a computer system, or it may be realized as a separate device which is capable of communicating with other computer systems and/or devices. Specifically, floorplanning apparatus 902 can comprise a floorplan-preparation mechanism 904, a design-planning mechanism 906, and a block-optimization mechanism 908.

In some embodiments, floorplanning apparatus 902 can generate a floorplan for a circuit design which satisfies a set of design constraints. Specifically, floorplan-preparation mechanism 904 can generate a reduced netlist from a non-reduced netlist. Then, design-planning mechanism 906 can use the reduced netlist to generate an intermediate version of a floorplan, and block-optimization mechanism 908 can use the non-reduced netlist to generate a final version of the floorplan based at least on the intermediate version of the floorplan.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A method for generating a floorplan for a hierarchical circuit design, wherein the hierarchical circuit design is represented using a set of blocks, and wherein the floorplan specifies an arrangement for the set of blocks which satisfies a set of design constraints, the method comprising:
   receiving a non-reduced netlist for the hierarchical circuit design, which includes a description of circuit elements in the set of blocks;
   generating, by computer, a reduced netlist from the non-reduced netlist, wherein for a block in the set of blocks, the reduced netlist includes a description of only those circuit elements in the block that are part of the block's interface logic; and
   using the reduced netlist to generate the floorplan for the hierarchical circuit design which satisfies the set of design constraints, wherein generating the floorplan comprises:
      identifying a first set of constraints that are applicable to the non-reduced netlist for the block;
      identifying a second set of constraints that are applicable to the reduced netlist for the block, wherein the second set of constraints is a subset of the first set of constraints;
      determining a set of internal logic constraints by identifying constraints that are in the first set of constraints, but that are not in the second set of constraints; and
      performing block optimizations on the floorplan based in part on the set of internal logic constraints for the block and floorplan information for the block.

2. The method of claim 1, wherein the set of design constraints includes at least one of: a timing constraint; a power constraint; a routing congestion constraint; an area constraint; a shape constraint; and a placement constraint.

3. The method of claim 1, wherein the block's interface logic includes:
   the block's interface pins;
   registers in the block that are coupled with the block's interface pins via a first combinational logic;
   the first combinational logic that couples the block's interface pins with the registers; and
   a second combinational logic which couples two or more of the block's interface pins.

4. The method of claim 1, wherein a hard macro instance of the block is classified as an interface logic element, thereby ensuring that the hard macro instance is preserved in the reduced netlist.

5. The method of claim 1, wherein the reduced netlist includes information about how the set of blocks are coupled with one another.

6. The method of claim 1, wherein generating the floorplan comprises:
   receiving an initial floorplan for the hierarchical circuit design; and
   adjusting a channel of the initial floorplan to alleviate congestion, while preserving the block's area during block shaping.

7. The method of claim 1, wherein generating the floorplan for the hierarchical circuit design by using the reduced netlist requires less computation than would be required when using the non-reduced netlist.

8. A non-transitory computer-readable storage medium storing instructions that when executed by a computer cause the computer to perform a method for generating a floorplan for a hierarchical circuit design, wherein the hierarchical circuit design is represented using a set of blocks, and wherein the floorplan specifies an arrangement for the set of blocks which satisfies a set of design constraints, the method comprising:
   receiving a non-reduced netlist for the hierarchical circuit design, which includes a description of circuit elements in the set of blocks;
   generating a reduced netlist from the non-reduced netlist, wherein for a block in the set of blocks, the reduced netlist includes a description of only those circuit elements in the block that are part of the block's interface logic; and
   using the reduced netlist to generate the floorplan for the hierarchical circuit design which satisfies the set of design constraints, wherein generating the floorplan comprises:

identifying a first set of constraints that are applicable to the non-reduced netlist for the block;

identifying a second set of constraints that are applicable to the reduced netlist for the block, wherein the second set of constraints is a subset of the first set of constraints;

determining a set of internal logic constraints by identifying constraints that are in the first set of constraints, but that are not in the second set of constraints; and performing block optimizations on the floorplan based in part on the set of internal logic constraints for the block and floorplan information for the block.

9. The non-transitory computer-readable storage medium of claim 8, wherein the set of design constraints includes at least one of: a timing constraint; a power constraint; a routing congestion constraint; an area constraint; a shape constraint; and a placement constraint.

10. The non-transitory computer-readable storage medium of claim 8, wherein the block's interface logic includes:
the block's interface pins;
registers in the block that are coupled with the block's interface pins via a first combinational logic;
the first combinational logic that couples the block's interface pins with the registers; and
a second combinational logic which couples two or more of the block's interface pins.

11. The non-transitory computer-readable storage medium of claim 8, wherein a hard macro instance of the block is classified as an interface logic element, thereby ensuring that the hard macro instance is preserved in the reduced netlist.

12. The non-transitory computer-readable storage medium of claim 8, wherein the reduced netlist includes information about how the set of blocks are coupled with one another.

13. The non-transitory computer-readable storage medium of claim 8, wherein generating the floorplan comprises:
receiving an initial floorplan for the hierarchical circuit design; and
adjusting a channel of the initial floorplan to alleviate congestion, while preserving the block's area during block shaping.

14. The non-transitory computer-readable storage medium of claim 8, wherein generating the floorplan for the hierarchical circuit design by using the reduced netlist requires less computation than would be required when using the non-reduced netlist.

15. An apparatus for generating a floorplan for a hierarchical circuit design, wherein the hierarchical circuit design is represented using a set of blocks, and wherein the floorplan specifies an arrangement for the set of blocks which satisfies a set of design constraints, comprising:
a floorplan-preparation mechanism configured to:
receive a non-reduced netlist for the hierarchical circuit design, which includes a description of circuit elements in the set of blocks; and
generate a reduced netlist from the non-reduced netlist, wherein for a block in the set of blocks, the reduced netlist includes a description of only those circuit elements in the block that are part of the block's interface logic; and
a design-planning mechanism configured to use the reduced netlist to generate the floorplan for the hierarchical circuit design which satisfies the set of design constraints, wherein the design-planning mechanism is configured to:
identify a first set of constraints that are applicable to the non-reduced netlist for the block;
identify a second set of constraints that are applicable to the reduced netlist for the block, wherein the second set of constraints is a subset of the first set of constraints;
determine a set of internal logic constraints by identifying constraints that are in the first set of constraints, but that are not in the second set of constraints; and
perform block optimizations on the floorplan based in part on the set of internal logic constraints for the block and floorplan information for the block.

16. The apparatus of claim 15, wherein the set of design constraints includes at least one of: a timing constraint; a power constraint; a routing congestion constraint; an area constraint; a shape constraint; and a placement constraint.

17. The apparatus of claim 15, wherein the block's interface logic includes:
the block's interface pins;
registers in the block that are coupled with the block's interface pins via a first combinational logic;
the first combinational logic that couples the block's interface pins with the registers; and
a second combinational logic which couples two or more of the block's interface pins.

18. The apparatus of claim 15, wherein the floorplan-preparation mechanism is further configured to classify a hard macro instance of the block as an interface logic element, thereby ensuring that the hard macro instance is preserved in the reduced netlist.

19. The apparatus of claim 15, wherein the reduced netlist includes information about how the set of blocks are coupled with one another.

20. The apparatus of claim 15, wherein the design-planning mechanism further comprises:
receiving an initial floorplan for the hierarchical circuit design; and
adjusting a channel of the initial floorplan to alleviate congestion, while preserving the block's area during block shaping.

21. The apparatus of claim 15, wherein generating the floorplan for the hierarchical circuit design by using the reduced netlist requires less computation than would be required when using the non-reduced netlist.

* * * * *